(12) United States Patent
Kadow et al.

(10) Patent No.: US 10,615,029 B2
(45) Date of Patent: Apr. 7, 2020

(54) DEVICE AND METHOD FOR MANUFACTURING THE DEVICE

(71) Applicant: Infineon Technologies AG, Neubiberg (DE)

(72) Inventors: Christoph Kadow, Gauting (DE); Uwe Seidel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/043,365

(22) Filed: Jul. 24, 2018

(65) Prior Publication Data

US 2019/0043716 A1 Feb. 7, 2019

(30) Foreign Application Priority Data

Jul. 25, 2017 (DE) .................. 10 2017 212 763

(51) Int. Cl.
| | | |
|---|---|---|
| *H01L 21/02* | (2006.01) | |
| *H01L 21/268* | (2006.01) | |
| *H01L 25/065* | (2006.01) | |
| *H01L 23/66* | (2006.01) | |
| *H01L 23/00* | (2006.01) | |

(52) U.S. Cl.
CPC ...... *H01L 21/02334* (2013.01); *H01L 21/268* (2013.01); *H01L 23/66* (2013.01); *H01L 24/14* (2013.01); *H01L 25/0657* (2013.01); *H01L 2223/6605* (2013.01)

(58) Field of Classification Search
CPC ............. H01L 21/02334; H01L 21/268; H01L 25/0657; H01L 24/14; H01L 23/66; H01L 2223/6605; H01L 2221/68377; H01L 2221/6834; H01L 21/6835; H01L 21/02019; H01L 21/02016
See application file for complete search history.

(56) References Cited

U.S. PATENT DOCUMENTS

| | | | |
|---|---|---|---|
| 2010/0225006 A1 | 9/2010 | Haba et al. | |
| 2012/0258594 A1* | 10/2012 | Barth | H01L 21/76898 438/667 |
| 2016/0190102 A1 | 6/2016 | Kawashita et al. | |

* cited by examiner

*Primary Examiner* — Nadine G Norton
*Assistant Examiner* — Mahmoud Dahimene
(74) *Attorney, Agent, or Firm* — Murphy, Bilak & Homiller, PLLC

(57) ABSTRACT

A method for manufacturing a device includes: providing a semiconductor substrate having an RF-device; providing a BEOL-layer stack on the first main surface of the semiconductor substrate; attaching a carrier structure to a first main surface of the BEOL-layer stack; removing a lateral portion of the semiconductor substrate which laterally adjoins the device region to expose a lateral portion of the second main surface of the BEOL-layer stack; and opening a contacting region of the BEOL-layer stack at the lateral portion of second main surface of the BEOL-layer stack.

17 Claims, 7 Drawing Sheets

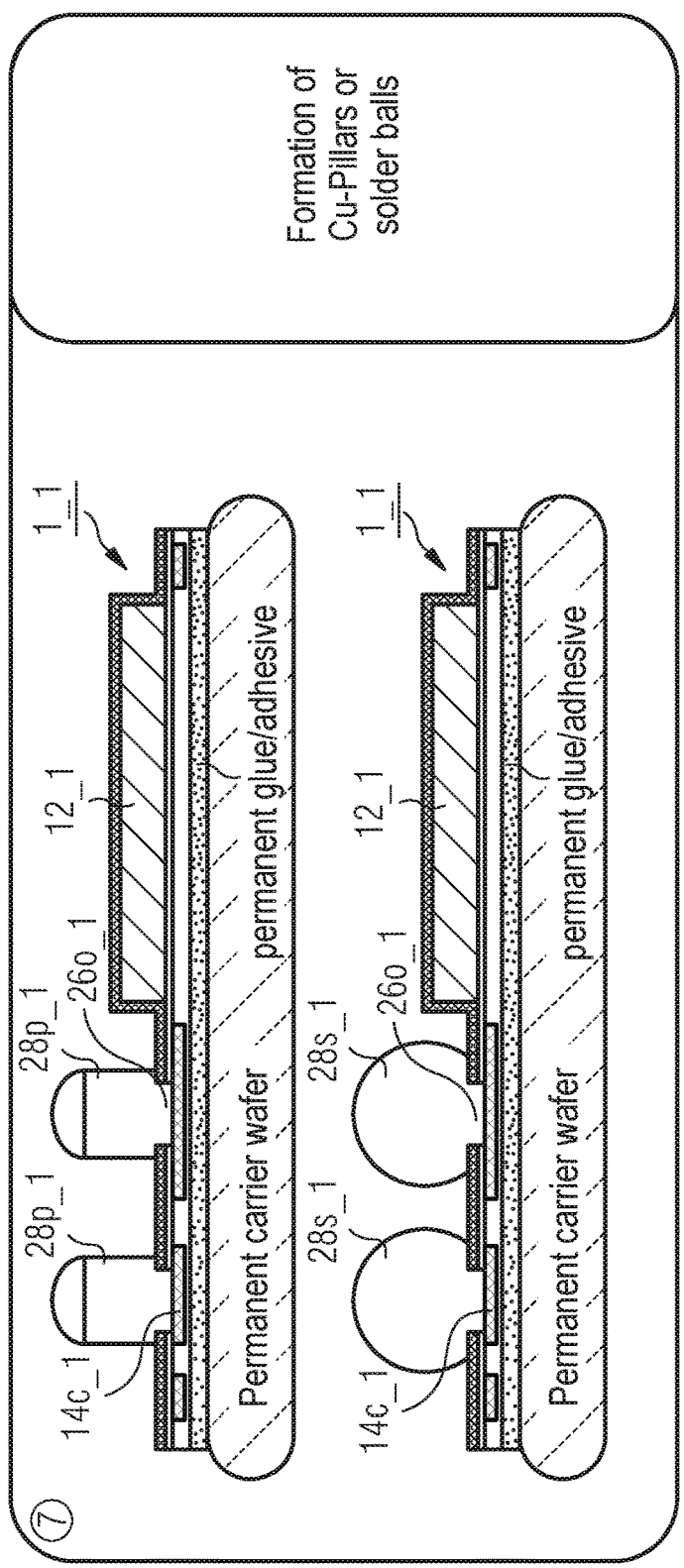
FIG 2G
FIG 2H
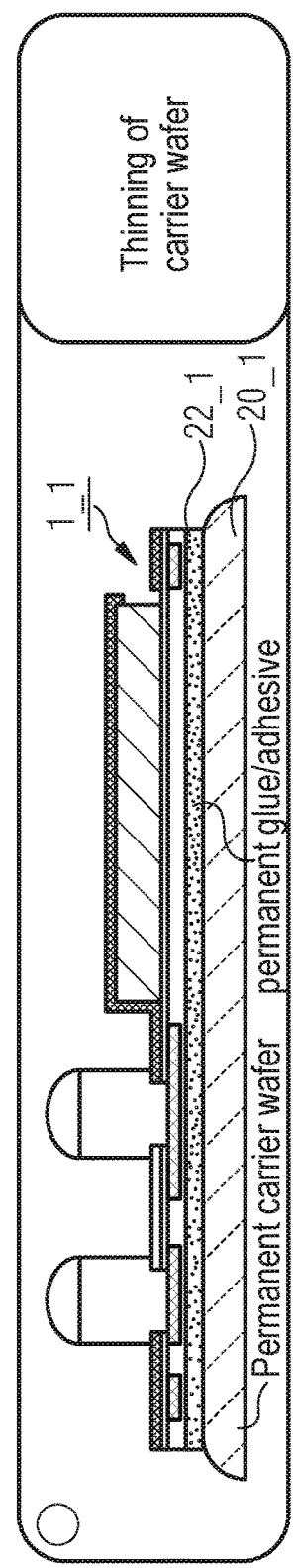
FIG 2I

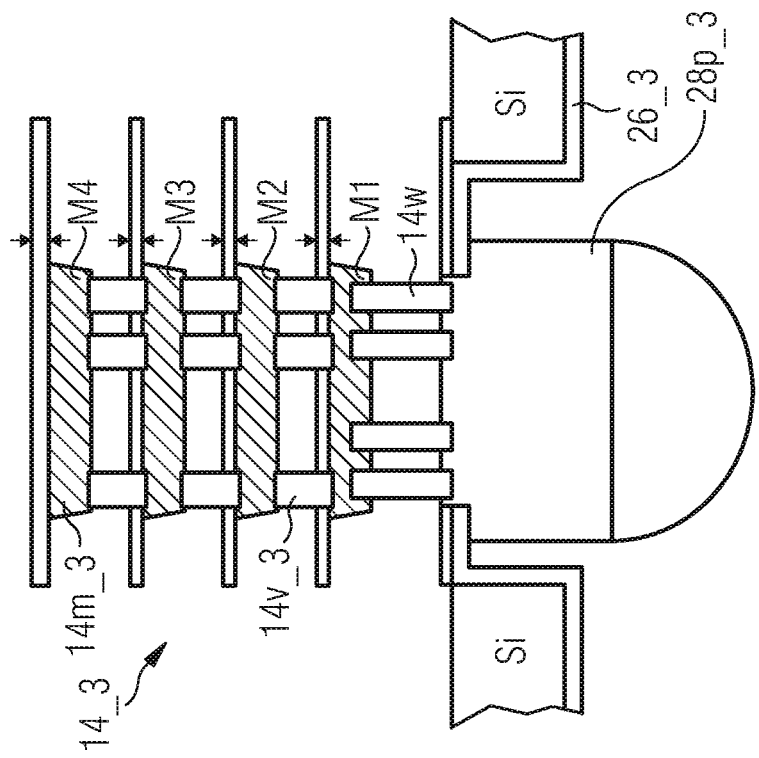
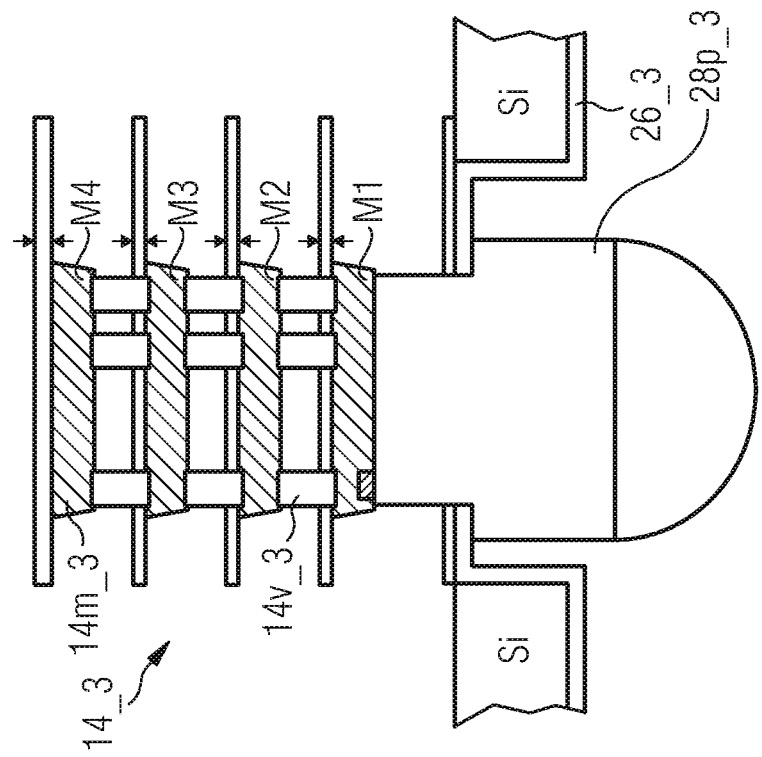

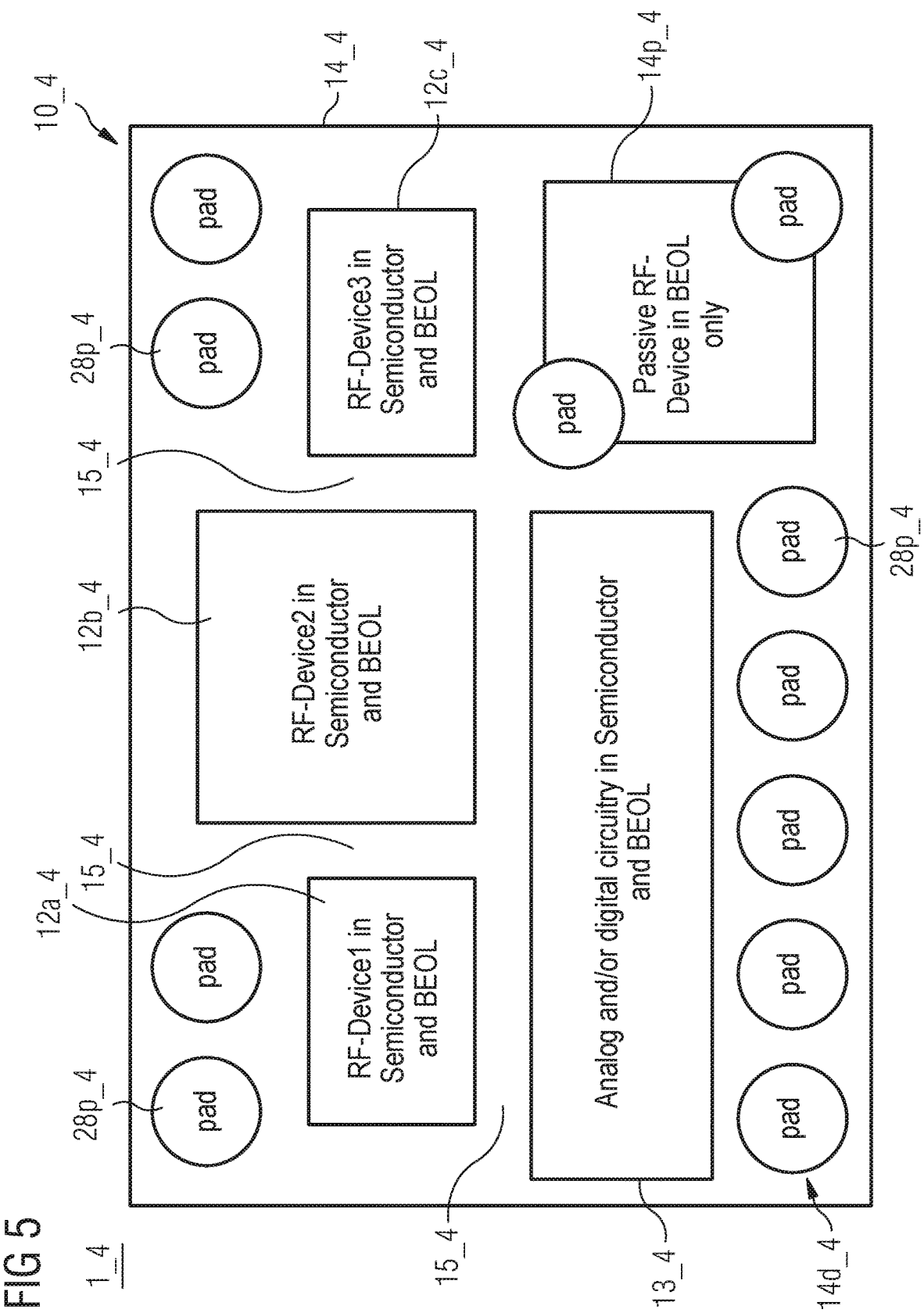

DEVICE AND METHOD FOR MANUFACTURING THE DEVICE

TECHNICAL FIELD

Embodiments described herein relate to a method for manufacturing a device and to the device itself.

BACKGROUND

High performance devices, like RF-devices typically have high requirements regarding linearity and low loss. The performance of RF-devices is often limited due to active and passive components of circuitry and due to capacitive and inductive interactions, e.g. with the substrate of the device. It became apparent that electrical charges within the substrate cause the interactions.

SUMMARY

Embodiments of the present invention provide a method for manufacturing a device. The method comprises: providing a semiconductor substrate having an RF-device; providing a BEOL-layer stack on a first main surface of the semiconductor substrate; attaching a carrier structure to a first main surface of the BEOL-layer stack; removing a lateral portion of the semiconductor substrate which laterally adjoins the device region to expose a lateral portion of the second main surface of the BEOL-layer stack; and opening a contacting region of the BEOL-layer stack at the lateral portion of second main surface of the BEOL-layer stack.

Regarding the carrier structure it should be noted that according to embodiments the attaching of the carrier structure is performed such that the carrier structure is permanently attached to the BEOL-layer stack, i.e. that the carrier structure belongs to the final product.

According to an embodiment, the step of removing is performed by removing the lateral portion of the semiconductor substrate from the second main surface, i.e. opposite to the first main surface, of the semiconductor substrate. According to embodiments, the removing can be performed by wet and/or dry etching.

According to another embodiment, the BEOL-layer stack is formed to comprise one or more metallization layers and one or more metal contacts, which are connected to the one or more metallization layers, wherein at least one of the metal contacts forms the contacting region of the BEOL-layer stack and wherein the one or more metal contacts are buried under the second main surface of the BEOL-layer stack, and wherein the metal contacts comprise wolfram.

According to an embodiment, the one or more metallization layers of the BEOL-layer stack are formed such that the RF-device is electrically connected to at least one of the metallization layers.

According to embodiments, the step of opening the contacting region is performed up to an etch stop structure, wherein at least one of a metallization layer of the BEOL-layer stack and a metal contact of the BEOL-layer stack is effective as the etch stop structure.

According to an embodiment the method comprises forming a contact element at the exposed contacting region of the BEOL-layer stack. The contact can, for example, comprise a metal pillar or a solder ball. According to an embodiment, the RF-device comprises a bulk silicon RF-device.

According to an embodiment the method further comprises forming an isolator layer on the exposed lateral portion of the second main surface of the BEOL-layer stack after removing the lateral portion of the semiconductor substrate. The forming is performed such that the isolator is formed on all exposed portions of the second main surface of the BEOL-layer stack, of a second main surface the semiconductor substrate and on exposed lateral sidewalls of the BEOL-layer stack or of the RF-device. Here, the step of opening the lateral portion of the BEOL-layer stack may, according to embodiments, comprise partially removing the isolator layer at the contacting region of the BEOL-layer stack. According to embodiments, the step of removing the lateral portion of the semiconductor substrate comprises etching the lateral portion of the semiconductor substrate.

According to embodiments the semiconductor substrate comprises at least one of a further RF-device and an electrical device integrated in a further device region at the first main surface of the semiconductor substrate, the further device region is laterally spaced apart from the device region. In this case, the forming of the BEOL-layer stack may be performed such that the RE-device is electrically connected to at least one of the further RF-device and the electrical device. Here, the step of removing the lateral portion of the semiconductor substrate may be performed by removing the lateral portion of the semiconductor substrate which laterally adjoins the device region and the further device region of the semiconductor substrate to expose a lateral portion of the second main surface of the BEOL-layer stack, wherein a recess is formed between the device region and the further device region.

According to another embodiment, the method further comprises the step of packaging the device by covering at least a part of the exposed lateral portion of the second main surface of the BEOL-layer stack with a mold material. With regard to the embodiment having two RF-devices or one RF-device and one other electrical device, the step of packaging the device can be performed such that the recess is at least partially filled with the mold material.

According to another embodiment, the method further comprises the step of thinning the semiconductor substrate from the second main surface of the semiconductor substrate before removing the lateral portion of the semiconductor substrate; and/or wherein the thinning is performed up to a target depth of 10 μm to 100 μm or 5 μm to 250 μm.

Another embodiment provides a device comprising a semiconductor substrate, a BEOL-layer stack, a carrier structure, a recess and an exposed contacting region. The semiconductor substrate comprises an RF-device integrated in a device region at a first main surface of the semiconductor substrate. The BEOL-layer stack arranged on the first main surface of the semiconductor substrate, wherein a second main surface of the BEOL-layer stack is arranged at the first main surface of the semiconductor substrate. The carrier structure is attached to a first main surface of the BEOL-layer stack. The recess within the semiconductor substrate is arranged in a lateral portion which laterally adjoins the device region of the semiconductor substrate and which exposes a lateral portion of the second main surface of the BEOL-layer stack. The exposed lateral portion is the so called contacting region of the BEOL-layer stack at the second main surface of the BEOL-layer stack.

According to a further embodiment the semiconductor substrate comprises at least one of a further RF-device and an electrical device integrated in a further device region at the first main surface of the semiconductor substrate, the further device region is laterally spaced apart from the device region, wherein the recess is formed between the device region and the further device region. According to embodiments, the recess may be at least partially filled with the mold material.

According to an embodiment the BEOL-layer stack comprises one or more metallization layers and one or more metal contacts, which are connected to the one or more metallization layers, wherein at least one of the metal contacts forms the contacting region of the BEOL-layer stack. According to an embodiment the metal contacts comprise wolfram. According to a further embodiment, the BEOL-layer stack comprises one or more metallization layers, wherein one of the metallization layers forms the contacting region of the BEOL-layer stack. According to another embodiment the device comprises a contact element at the exposed contacting region of the BEOL-layer stack, wherein the contact element comprising a metal pillar or a solder ball. Here, the contact element may extend up to a height which is higher than the depth of the recess.

According to an embodiment, the device comprises an isolator layer on the exposed lateral portion of the second main surface of the BEOL-layer stack. According to another embodiment, the carrier structure of the device is permanently attached to the BEOL-layer stack.

BRIEF DESCRIPTION OF THE DRAWINGS

Below, embodiments are discussed referring to the enclosed drawings:

FIGS. 2a-2i illustrate an enhanced method for manufacturing a device according to an enhanced embodiment;

FIGS. 4a-4b illustrate schematic block diagrams of different implementations for contacting the device from externally according to further embodiments; and FIG. 5 illustrates a schematic block diagram of a device according to an enhanced embodiment.

DETAILED DESCRIPTION

Below, embodiments of the teachings disclosed herein are discussed referring to the enclosed figures. Here, identical reference numbers are provided to objects having identical or similar function, so that the description thereof is mutually applicable and interchangeable.

Figure 1:
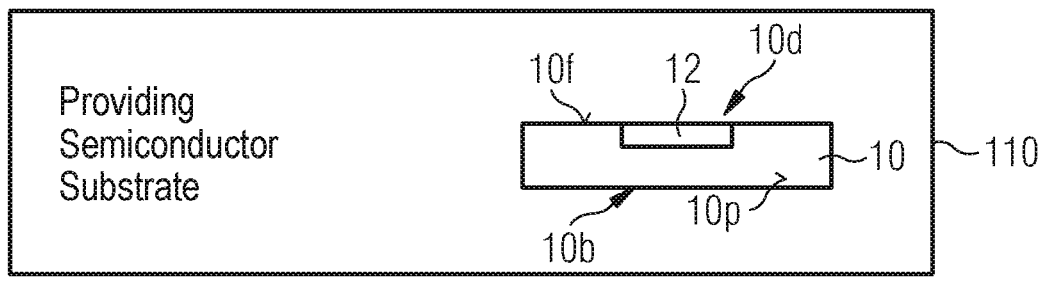
FIG. 1 illustrates a schematic flow chart of a method for manufacturing a device according to a basic embodiment.
Figure 1:
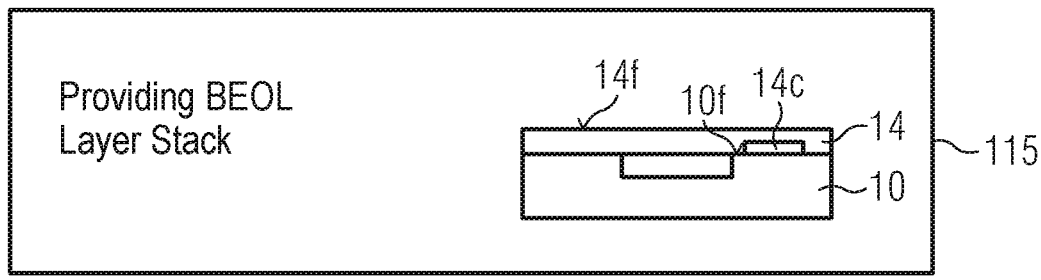
Figure 1:
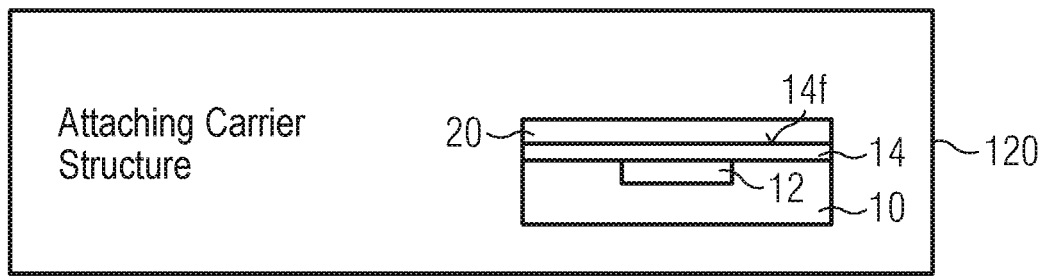
Figure 1:
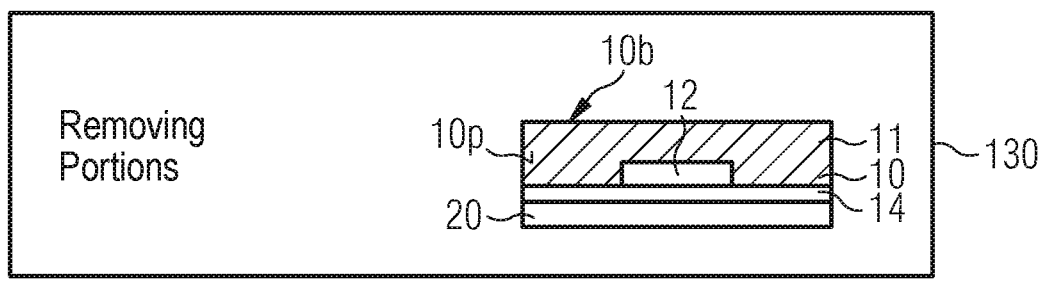
Figure 1:
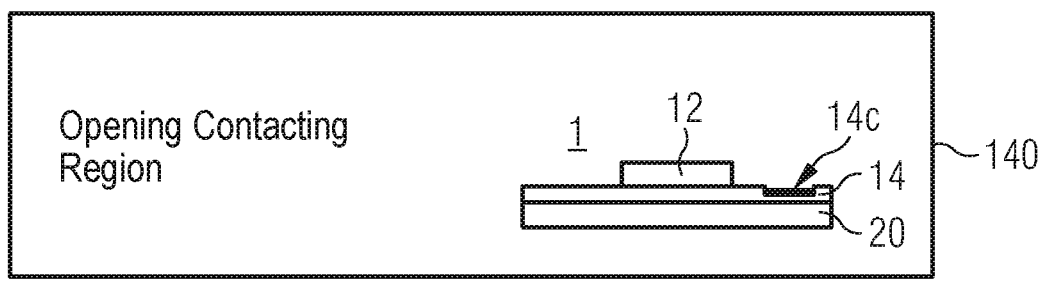

FIG. 1 shows a method 100 comprising basic steps 110, 115, 120, 130 and 140. Within each step, the resulting intermediate product is illustrated.

Step 110 refers to the providing of a semiconductor substrate 10 comprising an RF-device 12 integrated in a device region 10d of the semiconductor substrate 10 at a first main surface 10f of the substrate 10. From the lateral point of view the entire semiconductor substrate 10 may be subdivided in the device region 10d and a peripheral area 10p adjoining or surrounding the device region 10d. In other words, this means that the peripheral area 10p belongs to a volume portion of the semiconductor substrate 10 which laterally adjoins the device region 10d, i.e. a volume portion in which the RF-device 12 is formed. The RF-device 12 may include a single RF-element, like a transistor, or an RF-circuitry that includes a plurality of RF-elements. The RF-circuitry may include active devices, such as transistors, and/or passive devices, such as resistors, capacitors and inductors. Here, it should be noted that according to embodiments a bulk silicon may be used for the RF-device forming a bulk silicon RF-device, i.e. the semiconductor substrate may comprise a bulk silicon substrate.

For the next step 115, a BEOL-layer stack 14 (BEOL=back end of line) is formed on the first main surface 10f. The BEOL-layer stack 14 typically comprises a plurality of metal layers embedded in an isolating material and enables the electrical connection of the RF-device 12 with an external element or another electrical element or another RF-device. The BEOL-layer stack 14 has a first main surface 14f and a second main surface, wherein the second main surface of the BEOL-layer stack 14 is arranged at the first main surface 10f of the semiconductor substrate 10. Within the BEOL-layer stack 14, a so-called contacting region 14c is formed, which is exemplarily arranged at or buried under the second main surface of the BEOL-layer stack 14. From the lateral point of view the contacting region 14c is arranged in a configuration aligned with the peripheral area 10p.

For the step 120, a carrier structure 20, e.g. a permanent carrier structure, is attached to the first main surface 14f of the BEOL-layer stack 14, e.g., using an adhesive layer (not shown), such as a permanent adhesive material or glue. The carrier substrate or carrier structure 20 may comprise an isolating or semi-isolating material. It should be noted that the selected glue for the adhesive layer may also be isolating. The isolating properties of these layers act so that the interactions between charges within these layers and the RF-device 12 may be avoided or at least reduced. The permanent carrier structure 20 may be permanently attached to the BEOL-layer stack 14, so that same becomes part of the resulting final product. After this step 120 the device may be turned to the back side.

Within the step 130, one or more portions 11 marked by the hatching of the semiconductor substrate 10 around the RF-device 12 are removed. Here, the semiconductor substrate 10 may be thinned from its backside, i.e. from the second main surface 10b, e.g. using a grinding-polishing machine. The peripheral or lateral portion 10p laterally adjoining the device region 10d may be removed, e.g. using etching such as RIE (RIE=reactive ion) etching or dry etching or, in general, by anisotropic, isotropic etching or a combination thereof. This step 130 is performed to expose a lateral portion of the second main surface of the BEOL-layer stack 14.

At step 140, the contacting region 14c of the BEOL-layer stack 14 is opened at the exposed lateral portion of second main surface of the BEOL-layer stack 14. The contacting region 14c may, for example, be buried under the second main surface of the BEOL-layer stack 14 or under an optional isolating layer arranged on the lateral portion of second main surface of the BEOL-layer stack 14.

As a result, an essential portion of the semiconductor substrate has been removed such that the device 1 is free or almost free of semiconductor material as shown with respect to the device 1. Regarding the position of the contacting region 14c within BEOL-layer stack 14 it should be noted that the contacting of the same could not be done via the first main surface 14f, since the carrier is attached to the first main surface 14f. Instead the contacting, e.g. using contact elements, is done from the back side via the second main surface of the BEOL-layer stack 14.

High efficiency, low loss and good linearity behavior are common goals for the design of RF devices. It has been found out that an approach allows significantly increasing the efficiency, while maintaining the manufacturing costs. Here, the semiconductor material in which the RE-device is built, should be avoided as much as possible. Therefore, the semiconductor substrate material is removed within the peripheral areas which are not used as active areas. This approach leads to a situation that just the active areas, for example comprising an RF-device or RE-circuitry, remain, so there is no semiconductor substrate to carry the device. Therefore, a so-called carrier substrate, which may have isolating properties, is attached to the device, e.g., using an adhesive layer enabling to arrange the carrier substrate spaced apart from the active areas. This attaching is performed before the peripheral areas of the semiconductor substrate are removed. The resulting product is a device having an RE-device or RE-circuitry which is no longer surrounded by semiconductor material causing interactions between the RF-device and the free charge carriers within the semiconductor material, while the carrier substrate is arranged spaced apart from the RE-device, e.g. due to the BEOL-layer stack and/or the adhesive layer.

Below, a further embodiment for the manufacturing process 100 will be discussed referring to FIGS. 2a-2i.

Figure 2A:
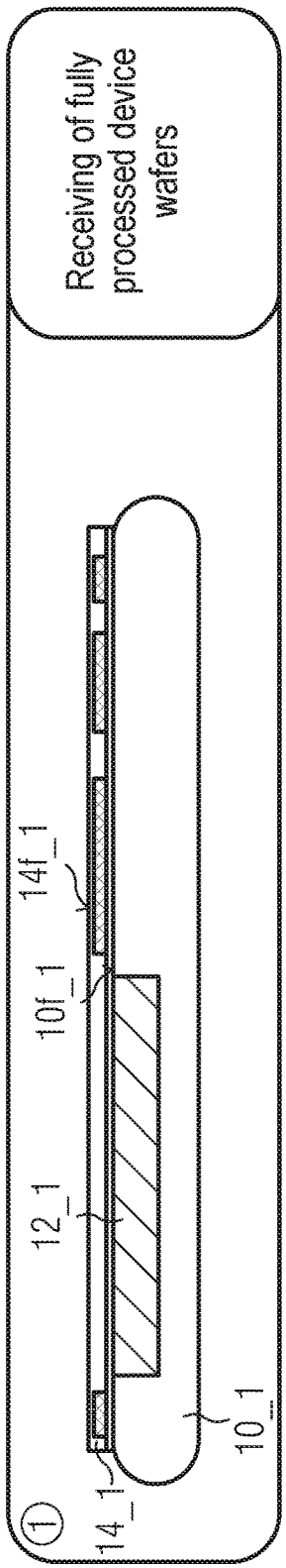

FIG. 2a illustrates the first step of the method, namely, the receiving of the fully processed device wafers. Here, the fully processed device wafer comprises the original substrate 10_1 including the device 12_1 as well as the BEOL-layer stack 14_1 deposited on the first main surface 10f_1 of the original substrate 10_1.

Figure 2B:
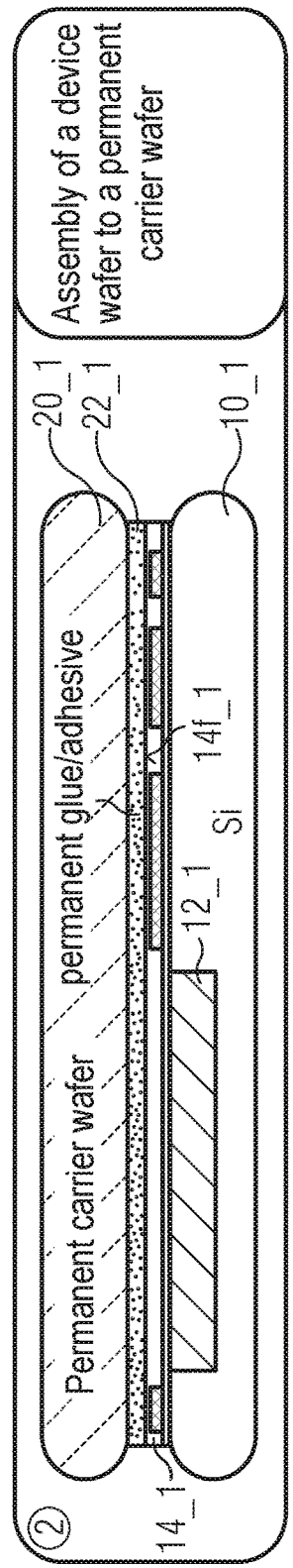

FIG. 2b shows the next step of the assembly of the device wafer 10_1 to a carrier structure comprising a permanent carrier 20_1 which could be made of silicon, glass, ceramic or other isolating or non-isolating material. In the embodiment, the carrier structure additionally comprises a permanent glue or adhesive layer 22_1 for the assembly of the permanent carrier 20_1. The permanent glue or adhesive layer 22_1 is arranged between the first main surface 14f_1 of BEOL-layer stack 14_1 and the permanent carrier 20_1. The attaching is performed, such that the adhesive layer 22_1 covers the first main surface 14f_1 of BEOL-layer stack 14_1. The permanent adhesive or glue layer 22_1 may have a thickness of 20 to 100 μm, or 50 to 120 μm or in general 5 to 250 μm.

Figure 2C:
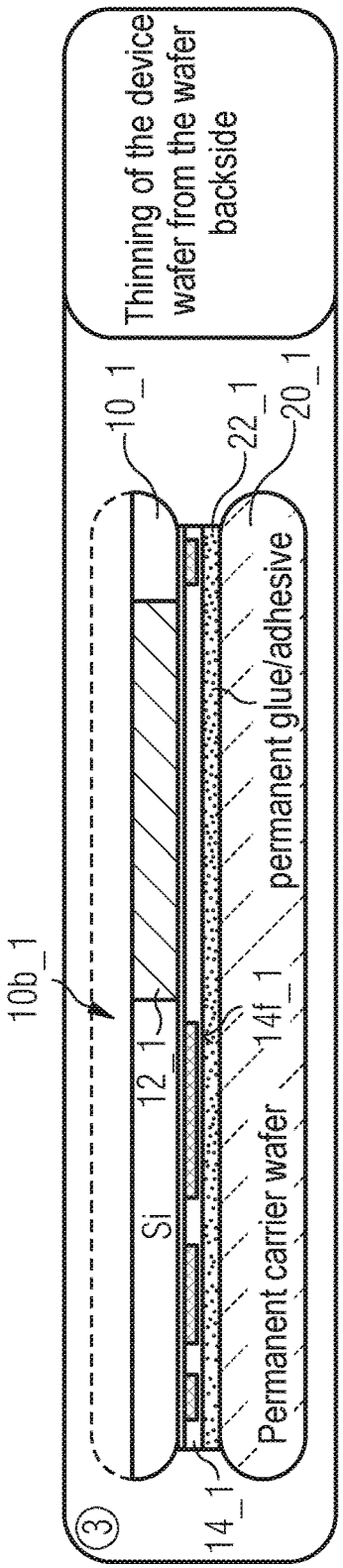

The next step is illustrated by FIG. 2c. Here, the semiconductor substrate 10_1 is thinned from the wafer back side 10b_1. The target thickness of the thinned semiconductor substrate 10_1 may be between 5 and 250 μm or between 10 and 100 μm. The thickness is selected such that the RF-device 12_1 or the necessary substrate material for carrying the device 12_1 remains. The thinning may be performed by mechanical and/or a combination of mechanical and chemical processing.

Figure 2D:
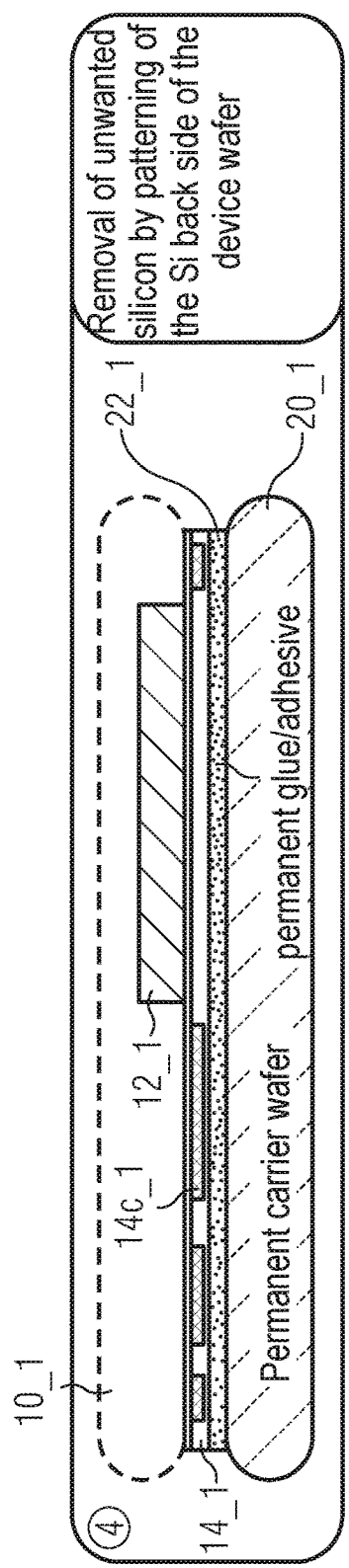

As shown by FIG. 2d, the peripheral areas laterally arranged adjacent to the RF-device 12_1 are removed afterwards, as illustrated by the outline of the formerly present semiconductor substrate 10_1. Dry etching such as conventional RIE etching or Bosch etching is used. This step enables the removal of the unwanted silicon or semiconductor material by patterning of the silicon back side of the chip leaving RF-device 12_1. The result is that the silicon of the carrier 10_1 is removed as much as possible, such that the back side of the chip has a topography which is defined by the respective thicknesses of the active parts or device region and the recess formed by the removing of the lateral portion of the semiconductor substrate 10_1. The recess exposes the second main surface of the BEOL-layer stack 14_1. Note that under the exposed second main surface contact regions 14c_1 may be arranged.

Figure 2E:
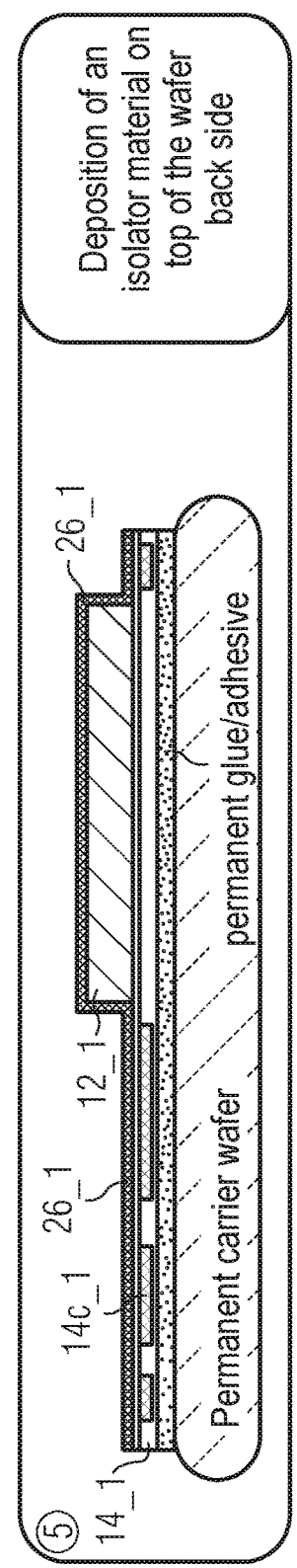

FIG. 2e shows an optional step of depositing an isolator material 26_1 on top of the wafer back side, i.e. the exposed lateral portion of the second main surface of the BEOL-layer stack 14_1 and/or the backside of the device region in which the device 12_1 is arranged. The isolator 26_1 may be formed, e.g. by conform deposition, on all exposed portions of the wafer back side. I.e. the isolator 26_1 may be formed on the Si substrate of the device 12_1, the exposed second main surface of the BEOL-layer stack 14_1 and the exposed lateral sidewalls of the device 12_1. The isolator 26_1 may include SIN, oxide or other, such as polyimide. In one embodiment, the isolator 26_1 may be formed by a stack of various material layers and at least one of the material layers may include one of the materials mentioned before.

In order to enable that the RF-device 12_1 can be electrically contacted from the back side via the contacting region 14c_1, the isolator 26_1 is opened from the back side as well as the BEOL-layer stack 14_1, e.g., up to the underlying metallization layer of the contacting region 14c_1 buried within the BEOL-layer stack 14_1. The opening may, according to embodiments, be done by etching. Here the metallization layers may have the purpose of an etch stop. This is illustrated by FIG. 2f.

Figure 2F:
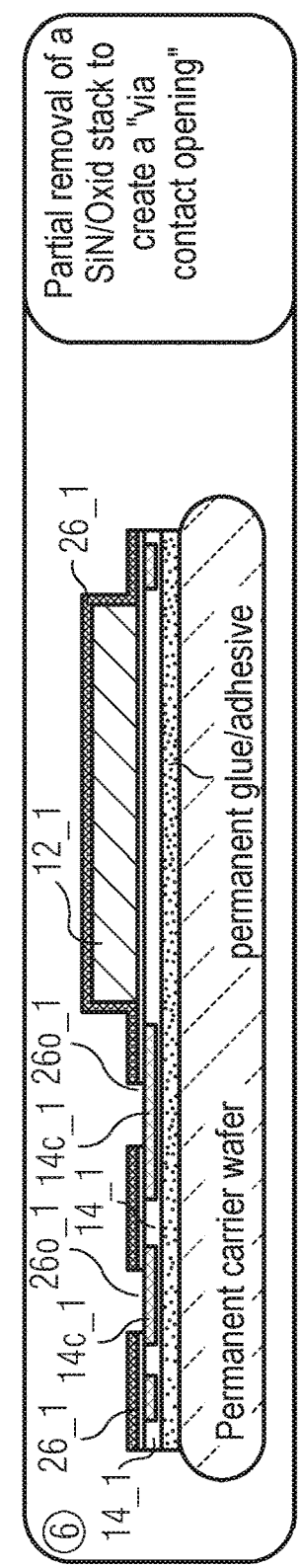

FIG. 2f shows the partial removal of the isolator 26_1 with the aim to open the BEOL-layer stack 14_1 and to expose the contacting region 14c_1. The resulting openings are marked by the reference numeral 26o_1.

After that, so-called contacting elements 28p can be provided from the back side such that the device 1_1 can be contacted externally. FIGS. 2g and 2h shows two different implementations of such contact elements 28p.

FIG. 2g shows in a first variant so-called Cu pillars 28p_1 which are arranged on or within the openings 26o_1. The Cu pillars 28p_1 are in contact with the BEOL layer stack. The Cu pillars 28p_1 could be built up by electrochemical deposition with a solder cap, made of high or low temperature solder material.

Alternatively, instead of the pillars 28p_1, so-called solder balls 28s_1 can be used, as illustrated by FIG. 2h. The solder balls 28s_1 are also arranged within the openings 26o, such that the same stay in contact with a metallization layer of the BEOL layer stack. The solder balls 28s_1 could be built up by electrochemical deposition or by ball placement technologies.

Both the Cu pillars 2p_1 and the solder balls 28s_1 are implemented such that the same extend with regard to their height over the RF-device 12_1, i.e. they are higher than the recess. This enables that the device 1_1 can be contacted from the back side, e.g. by mounting the device 1_1 with its back side on a board.

FIG. 2i shows an optional step during which the permanent carrier substrate 20_1 is thinned at its front side 20f_1. This has the purpose that the thickness of the device 1_1 is reduced, such that the device 1_1 fits in smaller packages. This thinning enables an adaption to different packaging thicknesses.

After that an optional packaging process may be performed, to form a housing for the chip.

Figure 3:
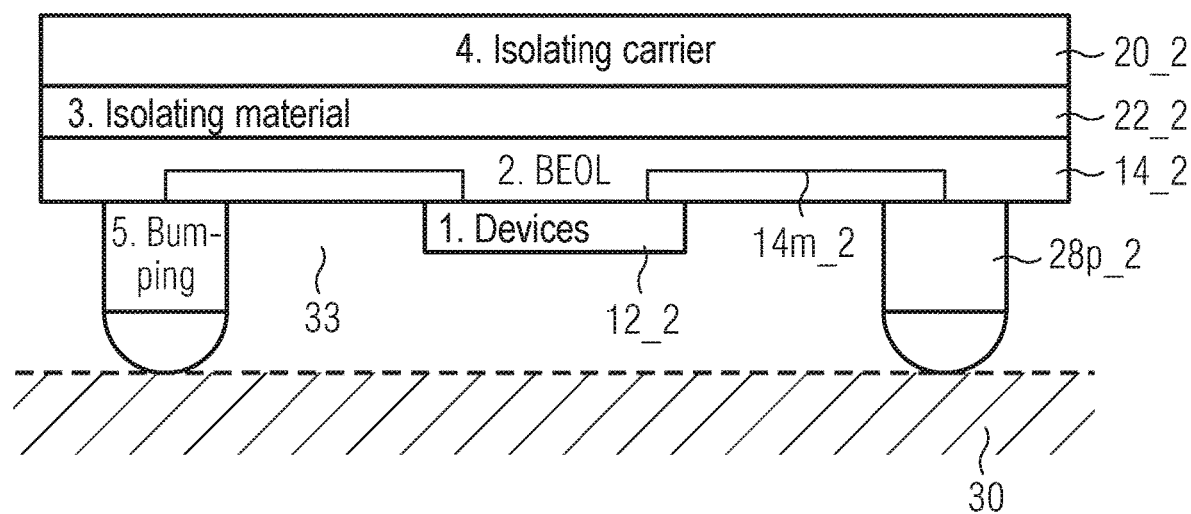
FIG. 3 illustrates a schematic block diagram of a device according to an embodiment.

FIG. 3 shows a schematic representation of the finished device 1_2. As can be seen, the device 1_2 comprises of the structure 20_2, which is attached to the BEOL-layer stack 14_2. The BEOL-layer stack 14_2 comprises a metallization 14m_2, which is to contact the RF-device 12_2. The bumping, or in general, the contacting elements 28p_2 are arranged at the sides of the RE-device 12_2, i.e., laterally displaced from the device 12_2, i.e. on the contact region of the BEOL-layer stack 14_2. The entire device 1_2 is mounted using the contacting elements 28p_2 to another substrate, such as a PCB board which is marked by the reference numeral 30. According to embodiments the device may be packaged, e.g. using a mold compound. For example, the mold compound may be arranged within the area between the RF-device 12_2 and the bumpings 28p_2. This area for the mold compound is marked by the reference numeral 33.

The devices 1, 1_1 and 1_2 as illustrated and described in connection with FIGS. 1-3 above can be used for high performance RE products such as RE-switches, LNAs and MM-wave-devices. Within all these applications, the devices 1, 1_1 and 1_2 can provide for a reduction of loss and non-linearities since the structure of the devices 1, 1_1 and 1_2 avoids free charges in the peripheral around the RF-device 12, 12_1 and 12_1. Additionally, it should be noted that the manufacturing effort is low as conventional materials and technologies can be used.

With respect to FIGS. 4a and 4b, two different variants will be discussed, how the BEOL-layer stack can be designed, such that metallization layers of the BEOL-layer stack can be contacted from the back side.

FIG. 4a shows an enlarged view of parts of FIG. 2i. Here, the isolating layer is marked by the reference numeral 26_3. The BEOL-layer stack 14_3 comprises metallization layers 14m_3 which may include a stacked pad starting from M1 to M4. Here, the pads of the stacked pad M1 to M4 may be connected to each other by a number of vias 14v3. Below the second main surface of the BEOL layer stack the first pad M1 of the stacked pad may be arranged. The first pad M1 may include copper and may serve as an etch stop structure during manufacturing of the Cu pillar 28p_3.

FIG. 4b shows an alternative embodiment in which the first pad M1 is connected to wolfram contacts 14w. These wolfram contacts 14w are metal contacts of the BEOL-layer stack 14_3 that may serve as an etch stop during manufacturing of the Cu pillar 28p_3.

FIG. 5 shows a schematic and transparent top view of a device 1_4. The device 1_4 comprises, for example, three RF-devices, like RF elements or RF circuitries, which are marked by the reference numerals 12a_4 to 12c_4. The three RE-devices 12a_4 to 12c4, in general the two or more RF-devices, are connected to each other by the backend of line layer, which is marked by the reference numeral 14_4. The area between the device regions having the devices 12a_4 to 12c_4 is processed as discussed above, such that the silicon or semiconductor material surrounding device regions is removed and a recess, also referred to as cavity, is formed.

The recesses (areas which are free or almost free of silicon) are marked by the reference numeral 15_4. The recess 15_4 may be filled or partially filled during the packaging process. Thus, according to embodiments the recess 15_4 may comprise a mold material.

According to another embodiment, the device 10_4 has adjacent to the three RF-devices 12a_4 to 12c_4 another electrical circuitry 13_4. This active or passive element 13_4 may comprise an analog and/or a digital circuitry like a controller or logic which is also separated from the RE-devices 12a_4 to 12c4 by an area 15_4 recess.

According to another embodiment, the backend of line layer stack 14_4 may comprise a passive RF-device 14p_4. This RF-device 14p_4 may be arranged in the backend of line layer 14_4 only. The area of the RF-device 14p_4 is laterally separated by a recess 15_4 from the other devices 12a_4 to 12c_3 or 13_4. Alternatively, to the passive RF-device 14p_4 another electrical device, like a resistor or capacitor, may be arranged.

According to another embodiment the device 1_4 may comprise one or more pads arranged within the backend of line layer stack 14_4. These pads are marked by the reference numeral 28p_4. As illustrated, the pads 28p_4 may be arranged surrounding or laterally surrounding the devices 12a_4 to 12c_3 and 13_4 or within a dedicated area 14d_4 or next to the area belonging to the element 14p_4.

The above described method enables to produce a plurality of chips in parallel. The plurality of chips is diced afterwards in order to obtain the single chips. After dicing, each chip comprises an RF-device and the carrier substrate, wherein the carrier substrate is not anymore in the shape of a wafer. However, the term substrate also refers to the carrier substrate after dicing.

Although some aspects have been described in the context of a device, it is clear that these aspects also represent a description of the corresponding method, wherein the block or element corresponds to a method step or feature of the method step. Analogously, aspects described in the context of a method step also represent a description of a corresponding block or item or feature of a corresponding apparatus.

The above described embodiments are merely illustrative for the principles of the present teachings. It is understood that modifications and variations of the arrangements and the details described herein will be apparent to others skilled in the art. In regard to the above described embodiments, it should be noted that a person skilled in the art may enhance the embodiments, e.g. by inserting additional intermediate layers between the above discussed layers. Such modifications do not have an influence to the teachings disclosed herein. Thus, modified implementations are covered by the scope of protection defined by the claims. It is the intent, therefore, to be limited only by the scope of the impending patent claims and not by the specific details presented by way of description and explanation of the embodiments herein.

What is claimed is:

1. A method for manufacturing a device, the method comprising:
   providing a semiconductor substrate having an RF-device integrated in a device region at a first main surface of the semiconductor substrate;
   providing a BEOL-layer stack on the first main surface of the semiconductor substrate, wherein a second main surface of the BEOL-layer stack is arranged at the first main surface of the semiconductor substrate, wherein the BEOL-layer stack comprises one or more metallization layers embedded in an isolating material;
   attaching a carrier structure to a first main surface of the BEOL-layer stack;
   removing all or essentially all semiconductor material of the semiconductor substrate which surrounds the device region, the removing exposing a portion of the second main surface of the BEOL-layer stack which is laterally offset from the device region; and
   opening a contacting region of the BEOL-layer stack at the exposed portion of the second main surface of the BEOL-layer stack.

2. The method of claim 1, wherein removing all or essentially all semiconductor material of the semiconductor substrate which surrounds the device region comprises:
   thinning the semiconductor substrate from a second main surface of the semiconductor substrate opposite the first main surface of the semiconductor substrate; and
   after the thinning, removing a lateral portion of the semiconductor substrate which laterally adjoins the device region.

3. The method of claim 2, wherein the thinning is performed up to a target depth of 10 µm to 100 µm or 5 µm to 250 µm.

4. The method of claim 1, wherein the contacting region of the BEOL-layer stack is opened up to an etch stop structure, and wherein at least one of a metallization layer of the BEOL-layer stack and a metal contact of the BEOL-layer stack forms the etch stop structure.

5. The method of claim 1, wherein the BEOL-layer stack comprises one or more metal contacts which are connected to the one or more metallization layers, wherein at least one of the metal contacts forms the contacting region of the BEOL-layer stack, wherein the one or more metal contacts are buried under the second main surface of the BEOL-layer stack, and wherein the one or more metal contacts comprise wolfram.

6. The method of claim 5, wherein the BEOL-layer stack is formed such that the RF-device is electrically connected to at least one of the one or more metallization layers.

7. The method of claim 1, further comprising:
forming a contact element at the exposed contacting region of the BEOL-layer stack, the contact element comprising a metal pillar or a solder ball.

8. The method of claim 1, wherein attaching the carrier structure to the first main surface of the BEOL-layer stack comprises permanently attaching the carrier structure to the BEOL-layer stack.

9. The method of claim 1, further comprising:
forming an isolator layer on the exposed portion of the second main surface of the BEOL-layer stack.

10. The method of claim 9, wherein opening the contacting region of the BEOL-layer stack comprises partially removing the isolator layer at the contacting region of the BEOL-layer stack.

11. The method of claim 2, wherein removing the lateral portion of the semiconductor substrate which laterally adjoins the device region comprises etching the lateral portion of the semiconductor substrate.

12. The method of claim 1, further comprising:
packaging the device by covering at least a part of the exposed portion of the second main surface of the BEOL-layer stack with a mold material.

13. The method of claim 1, wherein the semiconductor substrate comprises at least one of a further RF-device and an electrical device integrated in a further device region at the first main surface of the semiconductor substrate, the further device region being laterally spaced apart from the device region.

14. The method of claim 13, wherein the BEOL-layer stack is provided on the first main surface of the semiconductor substrate such that the RF-device is electrically connected to at least one of the further RF-device and the electrical device.

15. The method of claim 13, wherein removing all or essentially all semiconductor material of the semiconductor substrate which surrounds the device region comprises, after thinning the semiconductor substrate from a second main surface of the semiconductor substrate opposite the first main surface of the semiconductor substrate, removing a lateral portion of the semiconductor substrate which laterally adjoins the device region, and wherein removing the lateral portion of the semiconductor substrate comprises removing the lateral portion of the semiconductor substrate which laterally adjoins the device region and the further device region of the semiconductor substrate to expose a lateral portion of the second main surface of the BEOL-layer stack, wherein a recess is formed between the device region and the further device region.

16. The method of claim 13, further comprising:
packaging the device by covering at least a part of the exposed portion of the second main surface of the BEOL-layer stack with a mold material,
wherein during the packaging of the device, the recess is at least partially filled with the mold material.

17. The method of claim 1, wherein the RF-device is a bulk silicon RF-device.

* * * * *

UNITED STATES PATENT AND TRADEMARK OFFICE
CERTIFICATE OF CORRECTION

PATENT NO. : 10,615,029 B2
APPLICATION NO. : 16/043365
DATED : April 7, 2020
INVENTOR(S) : Kadow et al.

Page 1 of 1

It is certified that error appears in the above-identified patent and that said Letters Patent is hereby corrected as shown below:

On the Title Page

Item (57), Abstract, Lines 9, 10, please change "portion of second" to -- portion of the second --

Signed and Sealed this
Thirtieth Day of June, 2020

Andrei Iancu
*Director of the United States Patent and Trademark Office*